United States Patent [19]
Lin et al.

[11] Patent Number: 5,901,043
[45] Date of Patent: * May 4, 1999

[54] DEVICE AND METHOD FOR REDUCING THERMAL CYCLING IN A SEMICONDUCTOR PACKAGE

[75] Inventors: Peng-Cheng Lin, Cupertino; Hem P. Takiar, Fremont, both of Calif.

[73] Assignee: National Semiconductor Corporation, Santa Clara, Calif.

[*] Notice: This patent is subject to a terminal disclaimer.

[21] Appl. No.: 08/285,344

[22] Filed: Aug. 3, 1994

Related U.S. Application Data

[63] Continuation of application No. 08/025,296, Mar. 2, 1993, Pat. No. 5,339,216.

[51] Int. Cl.⁶ ............................................. H05K 7/20
[52] U.S. Cl. ..................... 361/707; 257/707; 257/713; 257/777; 361/723
[58] Field of Search .................... 257/706, 707, 257/712, 713, 720, 675, 669, 777, 796; 361/704, 707, 709–711, 723

[56] References Cited

U.S. PATENT DOCUMENTS 5,339,216   8/1994   Lin et al. .................................. 361/707

FOREIGN PATENT DOCUMENTS

| A 2 684 803 | of 1993 | France . |
| 60-137042 | 12/1983 | Japan . |
| 60-254756 | 5/1984 | Japan . |
| A 61-207 037 | of 1986 | Japan . |
| 63-250847 | 4/1987 | Japan . |
| A 63-052 451 | of 1988 | Japan . |
| 1-208847 | 2/1988 | Japan . |
| 2-14193 | 6/1988 | Japan . |
| A 02 028 353 | of 1990 | Japan . |

*Primary Examiner*—Gregory Thompson
*Attorney, Agent, or Firm*—Jeffrey K. Weaver; Beyer & Weaver, LLP

[57] ABSTRACT

In semiconductor packaging, a method and device for reducing thermal stress on a die and for reinforcing the strength of a die. A thermally-conductive member is positioned in a cooperating manner with the die during the packaging process.

9 Claims, 4 Drawing Sheets

DEVICE AND METHOD FOR REDUCING THERMAL CYCLING IN A SEMICONDUCTOR PACKAGE

This is a continuation of application Ser. No. 08/025,296 filed Mar. 2, 1993 now U.S. Pat. No. 5,339,216.

FIELD OF THE INVENTION

This invention relates generally to semiconductor packaging and more particularly to a device and method for reducing the thermal stress on an electrically-functional die and re-enforcing the strength of the die positioned within a package.

BACKGROUND OF THE INVENTION

A semiconductor package is used to house an integrated circuit (IC) chip to protect it and provide it with electrical connectors for attachment to an printed circuit (PC) board. As shown in FIG. 1, the IC chip or die 11 is positioned on top of a die attachment pad (DAP) 12 which is housed in a package 13, typically made of plastic. The die 11 is electrically connected to an PC board (not shown) by wires 14 which are connected to leads 16. The die 11 is attached to the DAP 12 by adhesive material 17 such as epoxy or soft solder.

During board assembly of electronic or computer products, each lead and IC board electrical connection is individually soldered. However, in surface mount technology, the IC chips' and board's electrical connections are formed by baking the entire unit in an oven at a temperature of approximately 230° C. The unit is then cooled to room temperature. The screening tests for military applications includes temperature extremes from −60° C. to 150° C. An electrically conductive adhesive material bonds the leads of the semiconductor package to the board. Surface mount technology provides a finished product of greatly reduced size and requires significantly less labor in its manufacture than one produced by conventional technology.

During processing the board and packaged IC chips, are therefore subjected to temperature extremes totalling approximately 230° C. These temperatures subject the IC chip contents of the semiconductor package to thermal stress which can damage and reduce the structural integrity of the IC chip.

The following table lists the coefficients of thermal expansion of the components of a semiconductor package.

Selected Packaging Materials Properties

| Material | Coefficient of Thermal Expansion CTE ($\times 10^{-6}$/° C.) | k (W/m. ° K.) | E ($\times 10^6$ psi) |
| --- | --- | --- | --- |
| Plastic Package i.e., Molding Compound (B-8) | 30–85 | 0.837 | 2.2 |
| Silicon | 2.8–3.6 | 84 | 10.6 |
| Copper | 18 | 398 | 18 |

It is evident therefrom, that there is substantial mismatch of thermal coefficients with respect to neighboring components. For example, the coefficient of thermal expansion of silicon of the die 11 is at least ten time higher than that of and the plastic molding compound of the package 13, such being a poor thermal conductor. The result of the mismatch is that the heat in the die 11 does not flow freely from the die 11 through a thick mold compound and therefore thermal stress is induced on the die 11.

Thermal stress on die 11 can cause varying levels of damage to the die. Because the die's ends 18 are subject to a much higher thermal stress during the heating and cooling stages of the package mounting on or demounting from the PC board, the die bends as shown in FIGS. 2A, 2B and 2C. The die also experiences high thermal stress when the device/package is going through thermal cycling continuously from peak loading to normal loading or from power-down to power-up during actual device/package life operating conditions. During the heating, the die tends to expand, however, this expansion is prohibited because of the mold compound and therefore, the thermal stress builds up. FIG. 2A represents the die's bending during the heating stage of processing. FIG. 2B portrays the die's configuration between heating and cooling, and FIG. 2C depicts the die's configuration during cooling. This repeated bending due to extreme temperature cycling and power cycling can cause the die to crack or delaminate. The die either becomes immediately non-functional or its life is shortened. In either event, the die's bending causes undesirable damage.

OBJECTS AND SUMMARY OF THE INVENTION

In light of the aforementioned problems with the prior art, it is therefore an object of the present invention to provide a device and method for reducing thermal stress of an electrically-functional die.

It is another object of the present invention to provide a device and method for re-enforcing the strength of an electrically-functional die within a semiconductor package.

It is also an object to recycle defective and rejected dies in practicing the present invention.

It is yet another object of the present invention to increase the test yield and therefore, the reliability of an electrically-functional die within a semiconductor package.

The foregoing and other objects of this invention are achieved by providing, in a semiconductor package containing a die, a non-electrically-functional, thermally conductive and substantially rigid member positioned adjacent to the die. The member can be a rejected and defective die.

BRIEF DESCRIPTION OF THE DRAWINGS

This invention will be more clearly understood from the following description when read in conjunction with the accompanying drawings, of which.

DETAILED DESCRIPTION OF THE PRESENT INVENTION

Figure 1:
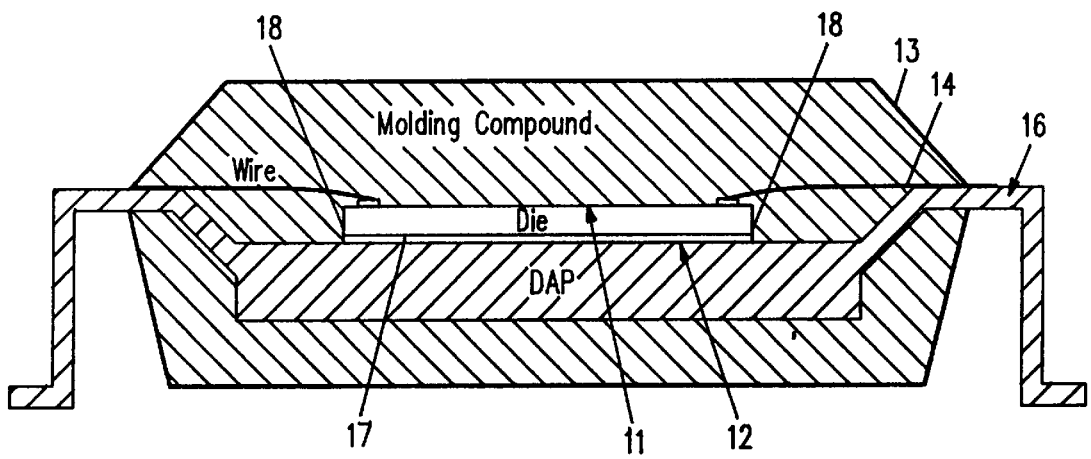
FIG. 1 is a schematic diagram of a semiconductor package of the prior art.
Figure 3:
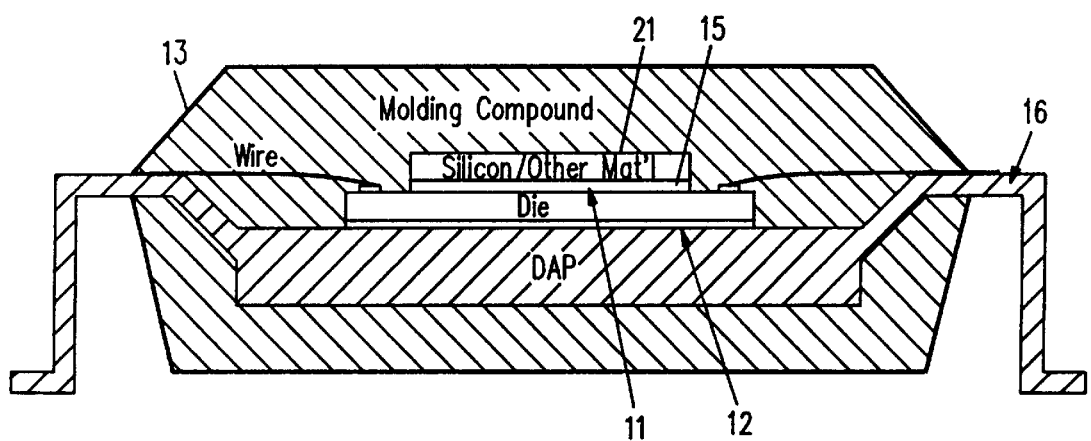
FIG. 3 shows a semiconductor package including a device of the present invention.

Referring to FIG. 3, a semiconductor package arrangement in accordance with the present invention is shown. A plastic package 13 houses an electrically-functional die 11 supported by a die attachment pad 12. Leads 16 provide electrical connection between the die 11 and an IC board (not shown). A member 21 is positioned adjacent to the die 11 in accordance with the present invention.

Member 21 is positioned so that it cooperates with die 11 to reduce thermal stress of die 11. Member 21 is made of a material having a coefficient of thermal expansion which allows the heat in the die to move across the junction of the common boundary of the die and the member 21, thereby allowing the heat to dissipate into member 21. Preferably, member 21 is made of a material having the same coefficient of thermal expansion as the die, and a much higher thermal conductivity than the encapsulated material, thereby allowing the heat to spread evenly. Therefore, because heat which in the prior art package remains in the die 11 is now able to dissipate into the member 21, the thermal stress on the die 11 is reduced in accordance with the present invention.

In the present invention, the member also provides rigid support to the die. Such support is not only beneficial during the temperature variations of the processing of the surface mount technology, but it is also beneficial during the end use of the semiconductor device. The rigid support of the die in addition to that provided by the die attachment pad 12 and the plastic package 13, further guarantees against damage to the die caused by vibration or shock. Furthermore, member 21 protects the electrically-functional die against extraneous thermal stress and environmental damage.

Member 21 is bonded to the die in a manner which provides for thermal conductivity between the die and the member. However, a bonding material which also provides for electrical conductivity, such as soft solder, should be avoided. Therefore, it is preferable to use a non-electrically-conductive adhesive such as epoxy to adhere the member to the die. Bonding material layer 15, while non-electrically-conductive, it is thermally conductive. Therefore, the thermal mass, including that of die 11 and member 21, such available to dissipate heat into package 13 is consolidated into a single heat dissipating structure.

Figure 4A:
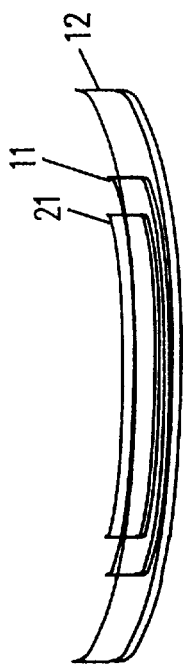
FIGS. 4A–4C depicts the device of the present invention positioned adjacent to a die which is on a die attachment pad, bending as they are subjected to a range of temperatures.
Figure 4B:
Figure 4C:
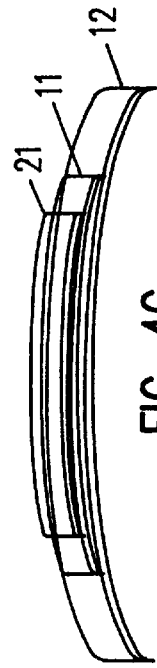
Figure 2A:
FIGS. 2A–2C depicts a die on a die attachment pad of the prior art bending as they are subjected to a range of temperatures.
Figure 2B:
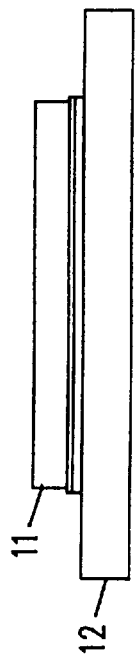
Figure 2C:

FIGS. 4A–4C Illustrate that while bending of the die 11 may not be entirely eliminated, it is reduced and therefore, thermal stress on the die is reduced. FIGS. 2A–2C and FIGS. 4A–4C are positioned next to each other to illustrate that during the heating phase of processing, there is less bending in FIG. 4A than shown in FIG. 2A. FIGS. 4B and 2B which depict each configuration during the thermal cycling, that is, between heating and cooling, show that each configuration goes through at least two contorting phases. By comparing FIG. 4C to FIG. 2C, it is evident that during the cooling phase of processing, there is less bending shown in FIG. 4C than shown in FIG. 2C. The reduction of bending during the heating and cooling phases provides for an end product less likely to suffer from cracks and delamination.

In a preferred embodiment of this invention, member 21 is a defective or rejected die. In the manufacture of semiconductor products, there are IC chips produced which do not meet specifications. In the past, there was no way to use these defective dies and therefore, they would be wastefully discarded. However, in accordance with the present invention, such defective dies are used as members 21 and therefore waste is avoided.

Furthermore, member 21 can be made from any suitable material such as any semiconductor, ceramic or dielectric material. In accordance with the present invention, the material of the member has a coefficient of thermal expansion similar to that of the die 11 or at least lower than that of the plastic used in package 13 so that heat can dissipate from the die 11 through member 21.

Figure 5:
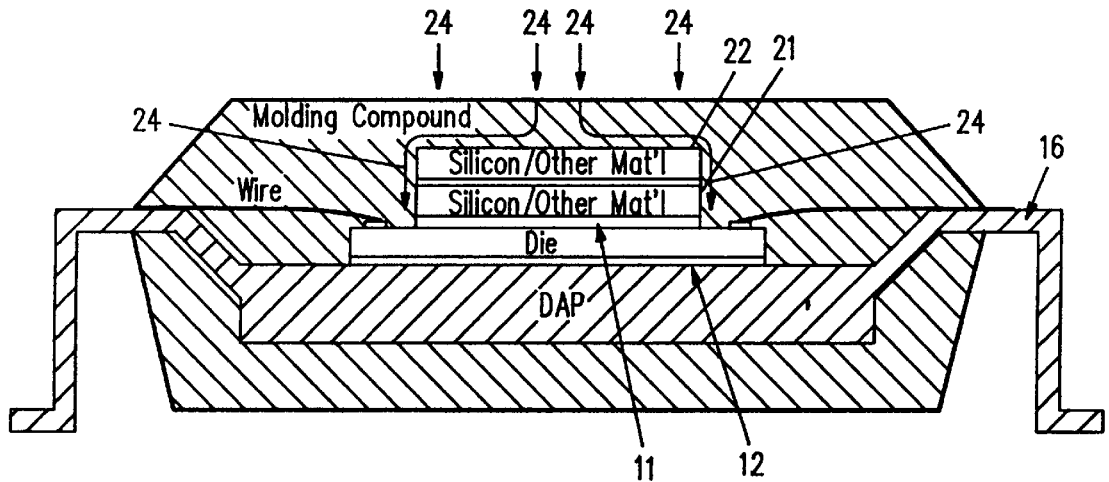
FIG. 5 shows an alternative embodiment of the present invention.
Figure 6:
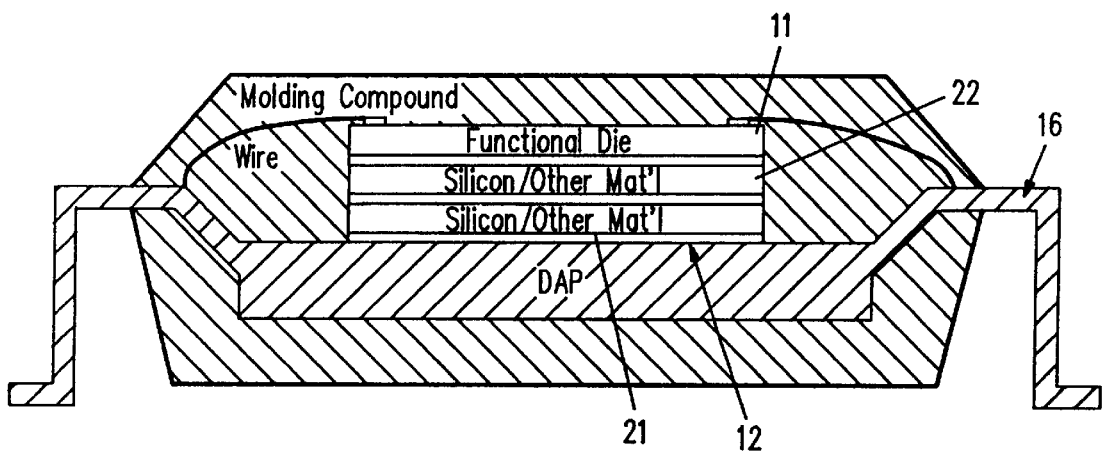
FIG. 6 shows a second alternative embodiment of this invention.
Figure 7:
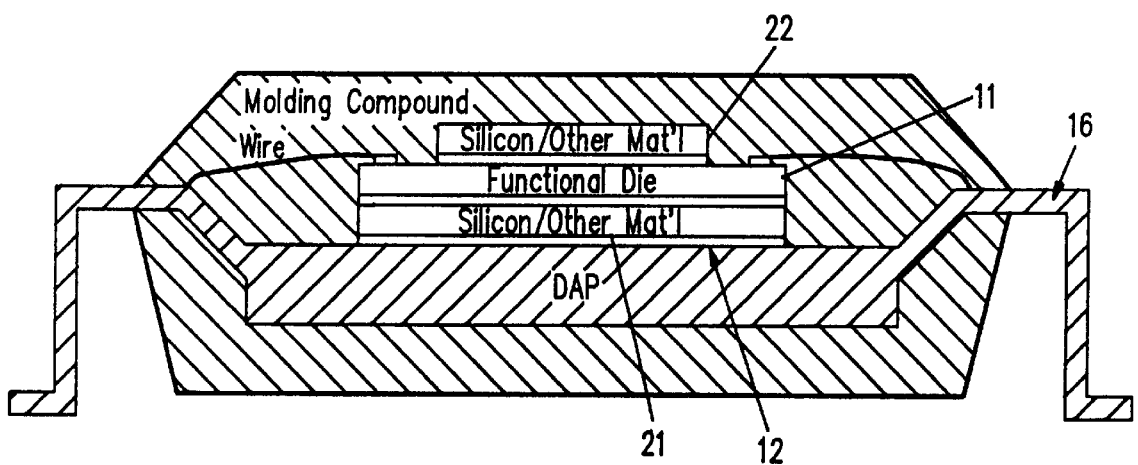
FIG. 7 shows yet another embodiment of the present invention.

The configuration of the member positioned so that it is in cooperation with the die within the semiconductor package can take many different forms. FIGS. 5–7 are illustrative of this point. FIG. 5 shows a configuration where one electrically-functional die is positioned in thermal cooperation with two members, 21 and 22 on top of the die. FIG. 6 shows a configuration where two members 21 and 22 are positioned in between the die attachment pad 12 and the die 11. FIG. 7 shows a the die 11 sandwiched between member 21 and member 22. Other configurations can be envisioned an are intended to be within the scope of this invention.

In the layered arrangements shown in FIGS. 5–7, a composite material is formed by joining the layers with bonding material layer 15, which is non-electrically-conductive and thermally conductive. The layered materials reinforce each other at each layer, and therefore the die 11. This is particularly important in the manufacturing process because the layers act like a cushion and therefore protect against mold stresses during the packaging process.

In FIGS. 3, 5 and 7, where the die is underneath one or more members 21 and 22,, the top member serves as a shield to protect the functional die 11 against moisture penetration. As illustrated by the arrows 24, in FIG. 5, to reach the die 11, the path that moisture travels is a longer distance in this stacking die approach of the present invention than in the single die approach. Accordingly, moisture related failure during the actual operation of the device is reduced.

What is claimed is:

1. In a semiconductor package containing at least one electrically-functional die having an active side to which a plurality of wires is attached, an arrangement comprising a die attachment pad on a top of which is said electrically-functional die, and a non-electrically functional, thermally conductive and substantially rigid die having a common boundary with the active side of the electrically-functional die in a thermally transferable and physically reinforcing position such that said non-electrically functional die reduces thermal stresses on said electrically-functional die and re-enforces the strength of said electrically-functional die, wherein the surface area of said non-electrically functionally die is different from that of said electrically-functional die so that said wires of the electrically-functional die are disposed beyond the common boundary of said non-electrically functional die and said electrically-functional die and wherein the die attachment pad, electrically-functionally die and non-electrically functional die are located inside a plastic molding compound.

2. An arrangement as recited in claim 1 wherein said non-electrically functional die is a defective die.

3. An arrangement as recited in claim 1, wherein said non-electrically functional die and said electrically-functional die are arranged in a manner which reduces moisture precipitation at the electrically-functional die.

4. An arrangement as recited in claim 1, wherein said arrangement comprises a plurality of non-electrically functional dies on top of said electrically-functional die.

5. An arrangement as recited in claim 1, further comprising a thermally conductive, non-electrically conductive bonding material disposed between said non-electrically functional die and said electrically-functional die.

6. The arrangement recited in claim 5, wherein said bonding material is a non-electrically conductive epoxy.

7. In a semiconductor package containing at least one electrically-functional die having an electrically active side on which a plurality of wires is disposed, said electrically-functional die being disposed on top of a die attachment pad, a method of reducing thermal stress on said electrically-functional die and for reinforcing the strength of said electrically-functional die, said die attachment pad and said electrically functional die located inside a plastic molding compound, said method comprising the step of locating a non-electrically functional thermally conductive and substantially rigid die with a surface area different from that of said electrically-functional die so as to have a common boundary with the active side of said electrically-functional die in a thermally transferable and physically reinforcing position such that the wires on said active side of the electrically-functional die are disposed beyond the common boundary of said electrically-functional die and said non-electrically functional die.

8. A method as recited in claim 7, further comprising the step of: attaching said electrically-functional die to said non-electrically functional die with a thermally conductive, non-electrically conductive bonding material.

9. A method as recited in claim 7, wherein said non-electrically functional die is a defective die.

* * * * *